(12) United States Patent
Kim et al.

(10) Patent No.: US 6,893,894 B2
(45) Date of Patent: May 17, 2005

(54) METHOD OF MANUFACTURING A COMPOUND SEMICONDUCTOR BY HEATING A LAYERED STRUCTURE INCLUDING RARE EARTH TRANSITION METAL

(75) Inventors: Joo-Ho Kim, Tsukuba (JP); Junji Tominaga, Tsukuba (JP)

(73) Assignees: Samsung Japan Corporation, Tokyo (JP); National Institute of Advanced Industrial Science and Technology Laboratory for Advanced Optical Technology, Ibaraki (JP)

( * ) Notice: Subject to any disclaimer, the term of this patent is extended or adjusted under 35 U.S.C. 154(b) by 84 days.

(21) Appl. No.: 10/382,070

(22) Filed: Mar. 4, 2003

(65) Prior Publication Data

US 2003/0186559 A1 Oct. 2, 2003

(30) Foreign Application Priority Data

Mar. 28, 2002 (JP) ........................................ 2002-092663

(51) Int. Cl.[7] ............................ H01L 21/00; H01L 21/31
(52) U.S. Cl. ........................... 438/95; 438/46; 438/779; 438/783; 438/796
(58) Field of Search ............................. 438/46, 93, 95, 438/779, 783, 796, 660, 761, 763, 795

(56) References Cited

U.S. PATENT DOCUMENTS

| | | | | |
|---|---|---|---|---|
| 5,232,790 A | * | 8/1993 | Arimune et al. | 428/694 TS |
| 5,518,826 A | * | 5/1996 | Kudoh et al. | 428/694 ML |
| 6,071,587 A | * | 6/2000 | Yoshinari et al. | 428/64.1 |
| 6,636,477 B1 | * | 10/2003 | Miyamoto et al. | 369/286 |
| 2002/0054564 A1 | * | 5/2002 | Koizumi et al. | 369/275.4 |

OTHER PUBLICATIONS

J.H. Kim et al, "Nanoelectronic Devices With Reactively Fabricated Semiconductor", Applied Physics Letters, vol. 80, No. 15, pp 2764–2766 (2002), Apr. 15, 2002, American Institute of Physics.

* cited by examiner

*Primary Examiner*—Matthew Smith
*Assistant Examiner*—Lex H. Malsawma
(74) *Attorney, Agent, or Firm*—Ladas & Parry LLP (57) ABSTRACT

A method of manufacturing a compound semiconductor includes the steps of forming a layered structure of dielectric layers including oxygen or sulfur, and an inter layer formed between the dielectric layers, including rare earth transition metal that is highly reactive to oxygen and sulfur, and heating the layered structure. As a result of the chemical reaction and diffusion of elements, one can change a heated portion of the layered structure to a semiconductor or an insulator, depending on the temperature to which the portion is heated.

22 Claims, 12 Drawing Sheets

FIG.1

FIG.2A  NOT HEATED

FIG.2B  HEATED AT 763° K

FIG.2C  HEATED AT 783° K

TEM

ZnS-SiO₂ LAYER
TbFeCo LAYER
ZnS-SiO₂ LAYER 20 nm

EDP

TbFeCo LAYER

FIG.3

FIG. 4A NOT HEATED

FIG. 4B HEATED AT 763° K

FIG. 4C HEATED AT 783° K

METHOD OF MANUFACTURING A COMPOUND SEMICONDUCTOR BY HEATING A LAYERED STRUCTURE INCLUDING RARE EARTH TRANSITION METAL

BACKGROUND OF THE INVENTION

1. Field of the Invention

The present invention relates generally to compound semiconductors, and more particularly, to a method of manufacturing a compound semiconductor and a compound insulator by heating a layered structure having an inter layer of a rare earth metal and/or a transition metal sandwiched between dielectric layers so as to induce chemical reaction and diffusion of elements, and to a compound semiconductor apparatus such as a photo cell, an electronic circuit, a transistor, and a memory device.

2. Description of the Related Art

A compound semiconductor is conventionally manufactured from a crystal. For example, a gallium arsenic semiconductor is manufactured by injecting an impurity into the crystal of gallium arsenic compound so as to make free electrons and holes. The type of compound semiconductor, that is "p-type" or "n-type", depends on the ratio of each element of the compound.

Compound semiconductors are generally classified based on the number of elements included in the compound. For example, gallium arsenic and indium phosphorus consist of two elements; aluminum gallium arsenic and gallium indium arsenic consist of three elements; and gallium indium arsenic phosphorus consists of four elements.

Gallium arsenic compound semiconductors are widely used for applications such as computers that require high speed operation because free electrons in the gallium arsenic compound semiconductor move faster than those in a silicon semiconductor. Thanks to its high efficiency of light emission, gallium arsenic compound semiconductors are also used widely for light-emitting diodes.

The compound semiconductor, however, still has the following problems: complex manufacturing process, low yield, and difficulty in adjusting properties.

SUMMARY OF THE INVENTION

Accordingly, it is a general object of the present invention to provide a novel and useful compound semiconductor in which one or more of the problems described above are eliminated.

Another and more specific object of the present invention is to provide a method of manufacturing a compound semiconductor and a compound insulator by heating a layered structure having an inter layer of rare earth transition metal, rare earth metal, transition metal, or both rare earth metal and transition metal sandwiched between dielectric layers including oxygen and/or sulfur with which the rare earth transition metal, rare earth metal, transition metal, or both rare earth metal and transition metal are highly active so as to induce chemical reaction and diffusion of the elements, and a compound semiconductor apparatus such as a photo cell, an electronic circuit, a transistor, a dynamic random access memory, and a flash memory.

To achieve one of the above objects, a method of manufacturing a compound semiconductor according to an aspect of the present invention, includes the steps of forming a layered structure of a plurality of dielectric layers and an inter layer formed between said dielectric layers, said dielectric layers including one of oxygen, sulfur, and both oxygen and sulfur, said inter layer including one of rare earth transition metal, rare earth metal, transition metal, and both rare earth metal and transition metal that are highly reactive to oxygen and sulfur, and heating said layered structure so as to induce chemical reaction and diffusion of elements.

As a result of the chemical reaction and diffusion of elements such as oxygen, sulfur, and rare earth transition metal, one can turn the layered structure into a semiconductor.

According to another aspect of the present invention, a compound semiconductor can be manufactured by a method including the steps of forming a layered structure of a plurality of dielectric layers and an inter layer formed between said dielectric layers, said dielectric layers including one of oxygen, sulfur, and both oxygen and sulfur, said inter layer including one of rare earth transition metal, rare earth metal, transition metal, and both rare earth metal and transition metal that are highly reactive to oxygen and sulfur, and heating said layered structure so as to induce chemical reaction and diffusion of elements.

The compound semiconductor thus manufactured can be used as a part of an electronic circuit, a photo cell, a memory, a flash memory, and so forth.

According to yet another aspect of the present invention, a method of manufacturing a compound insulator can be realized by changing the temperature at which the layered structure is heated.

As a result of the chemical reaction and diffusion of the elements, one can change the layered structure to an insulator by adjusting the temperature appropriately.

According to yet another aspect of the present invention, a compound insulator can be manufactured by the above method.

A photo cell according to an aspect of the present invention can be manufactured by using the above compound semiconductor.

A method of manufacturing an electronic circuit according to an aspect of the present invention, includes the steps of forming a layered structure of dielectric layers and an inter layer formed between said dielectric layers, said dielectric layers including one of oxygen, sulfur, and both oxygen and sulfur, said inter layer including one of rare earth transition metal, rare earth metal, transition metal, and both rare earth metal and transition metal that are highly reactive to oxygen and sulfur, and heating portions of said layered structure to at least one of a temperature of less than 753° K. so as to form a conductive unit, a temperature of 753° K. or more and less than 783° K. so as to form a semiconductor unit, and a temperature of 783° K. or more so as to form an insulator unit by inducing chemical reaction and diffusion of elements.

Since a portion of the layered structure can be converted into a semiconductor or an insulator depending on the temperature at which the portion is heated, it is possible to form an electronic circuit on the layered structure by selectively heating portions to appropriate temperatures.

The electronic circuit according to another aspect of the present invention can be manufactured by the above method.

According to other aspects of the present invention, a transistor, a memory, and a flash memory can be manufactured in the same manner in which the above electronic circuit is manufactured.

Other objects, features, and advantages of the present invention will become more apparent from the following detailed description when read in conjunction with the accompanying drawings.

DETAILED DESCRIPTION OF THE PREFERRED EMBODIMENTS

The preferred embodiments of the present invention will be described in detail by reference to the drawings.

Figure 1:
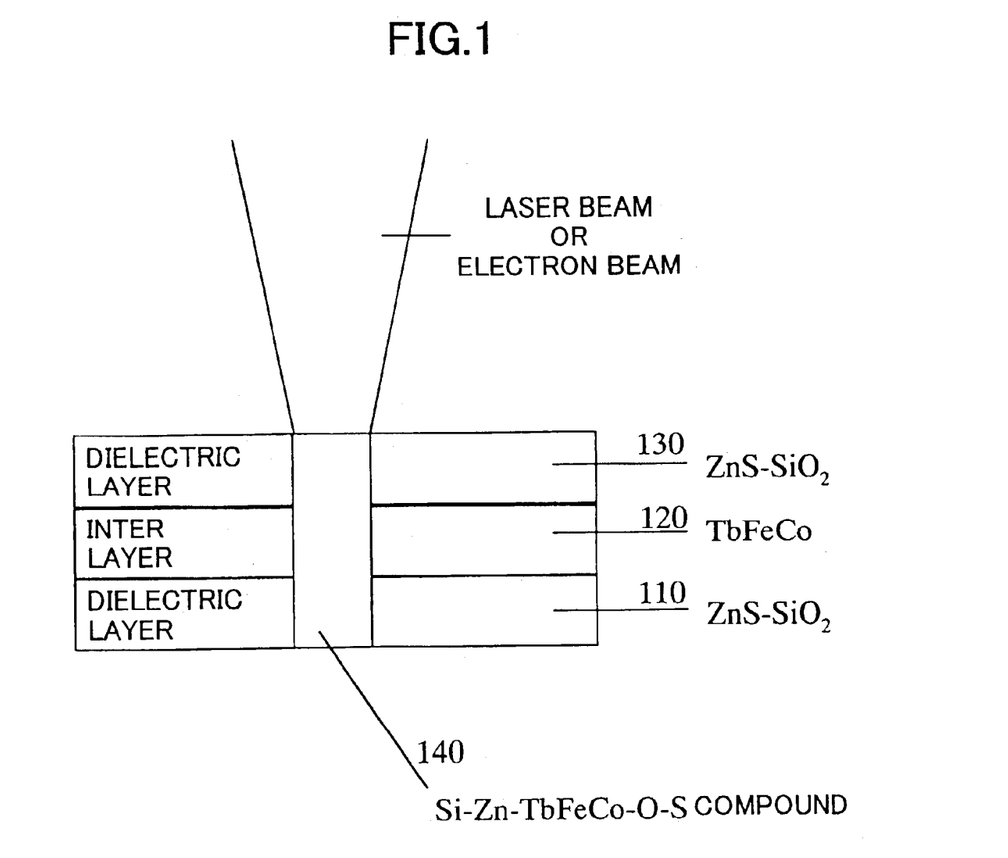
FIG. 1 is a cross-sectional diagram showing a layered structure of a compound semiconductor according to an embodiment of the present invention, in which an inter layer of a compound of rare earth metal and a transition metal are sandwiched by dielectric layers.

A compound semiconductor according to an embodiment of the present invention is manufactured using a layered structure showed in FIG. 1. The layered structure consists of dielectric layers 110, 130 and an inter layer 120 of a rare earth transition metal sandwiched by the dielectric layers 110 and 130.

The compound semiconductor according to an embodiment may be manufactured using a single layer structure to be obtained by forming the dielectric layer 110, the inter layer 120 of a rare earth transition metal, and the dielectric layer 130 so as to form a monolithic layer of the elements mixed therein.

The dielectric layers 110 and 130 are made of ZnS—$SiO_2$, for example. The dielectric layers 110 and 130 may be made of other dielectric material including oxygen and/or sulfur.

The inter layer 120 is made of a compound including a rare earth transition metal such as TbFeCo. The inter layer 120 may be made of another rare earth metal, a transition metal, or both rare earth metal and transition metal such as $Tb_2S_3$, $Tb_2O_3$, $TbO_2$, FeS, FeO, $Fe_2O_3$, $Fe_3O_4$, $CO_2S_2$, CoS, $Co_3O_4$ that is active with oxygen and/or sulfur.

A portion 140 of the layered structure showed in FIG. 1 is heated by a laser beam or an electron beam so as to induce chemical reaction and diffusion of ZnS—$SiO_2$ in the dielectric layers and TbFeCo in the inter layer. As a result, a compound of Si—Zn—TbFeCo—O—S is formed in the heated portion 140 since sulfur and oxygen diffuse into the inter layer 120.

The electric characteristics of the compound formed in the heated portion 140 depend on the temperature up to which the portion 140 is heated. The compound of Si—Zn—TbFeCo—O—S becomes a conductor if the portion 140 is heated up to an absolute temperature of less than 753° K.; the compound of Si—Zn—TbFeCo—O—S becomes a semiconductor if the portion 140 is heated up to an absolute temperature between 753° K.–783° K.; and the compound of Si—Zn—TbFeCo—O—S becomes an insulator if the portion 140 is heated up to an absolute temperature 783° K. or more.

The physical and chemical characteristics of the Si—Zn—TbFeCo—O—S compound formed as a result of the heating are examined through various experiments.

For the experiments, a layered structure consisting of a 100 nm-thick $ZnSiO_2$ dielectric layer, a 20 nm-thick TbFeCo inter layer, and a 50 nm-thick $ZnSiO_2$ dielectric layer was formed on a silicon substrate.

Figure 2A:
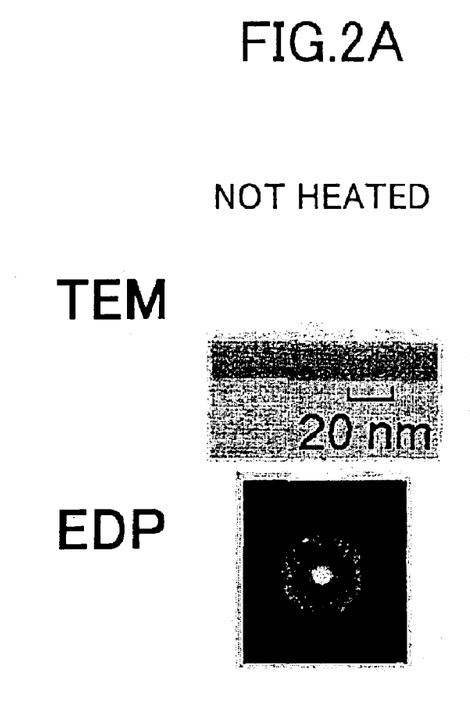
FIGS. 2A–2C are pictures showing the change in TEM image and EDP image of the layered structures of a compound semiconductor according to an embodiment of the present invention, depending on temperature to which the layered structures are heated.
Figure 2B:
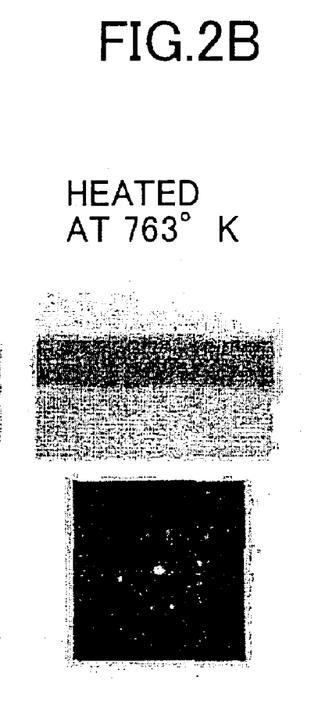
Figure 2C:
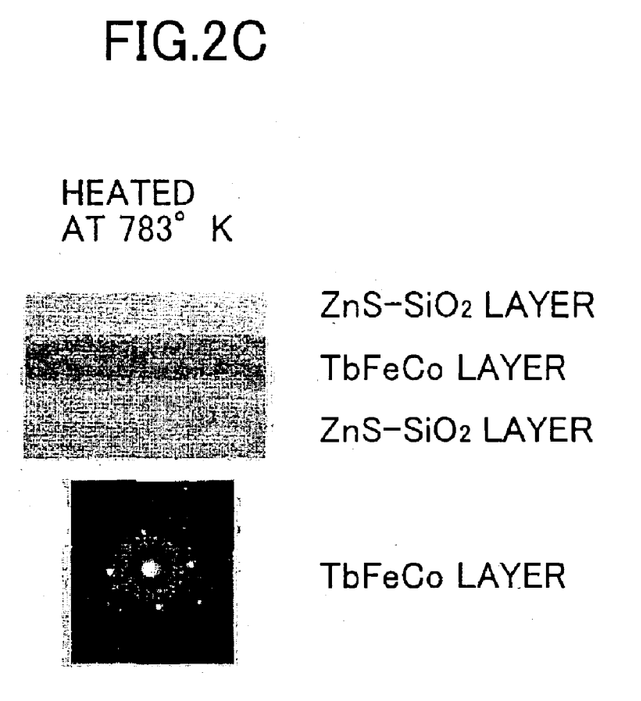

As showed in FIGS. 2A–2C, the pictures of layered structures were taken using a transmission electron microscope (TEM) and electron diffraction pattern (EDP) method. The picture taken by TEM shows the extent of chemical reaction and diffusion induced by the heating using a laser beam or an electron beam. The picture taken by EDP shows the extent of crystallizing.

FIG. 2A shows a TEM picture and an EDP picture of a layered structure that was not heated at all. It is noted that chemical reaction, diffusion, and crystallization are little induced.

FIG. 2B shows a TEM picture and an EDP picture of a layered structure that was heated to 763° K. It is noted that chemical reaction, diffusion, and crystallization are induced to some extent.

FIG. 2C shows a TEM picture and an EDP picture of a layered structure that was heated to 783° K. It is noted that chemical reaction, diffusion, and crystallization are greatly induced.

Figure 3:
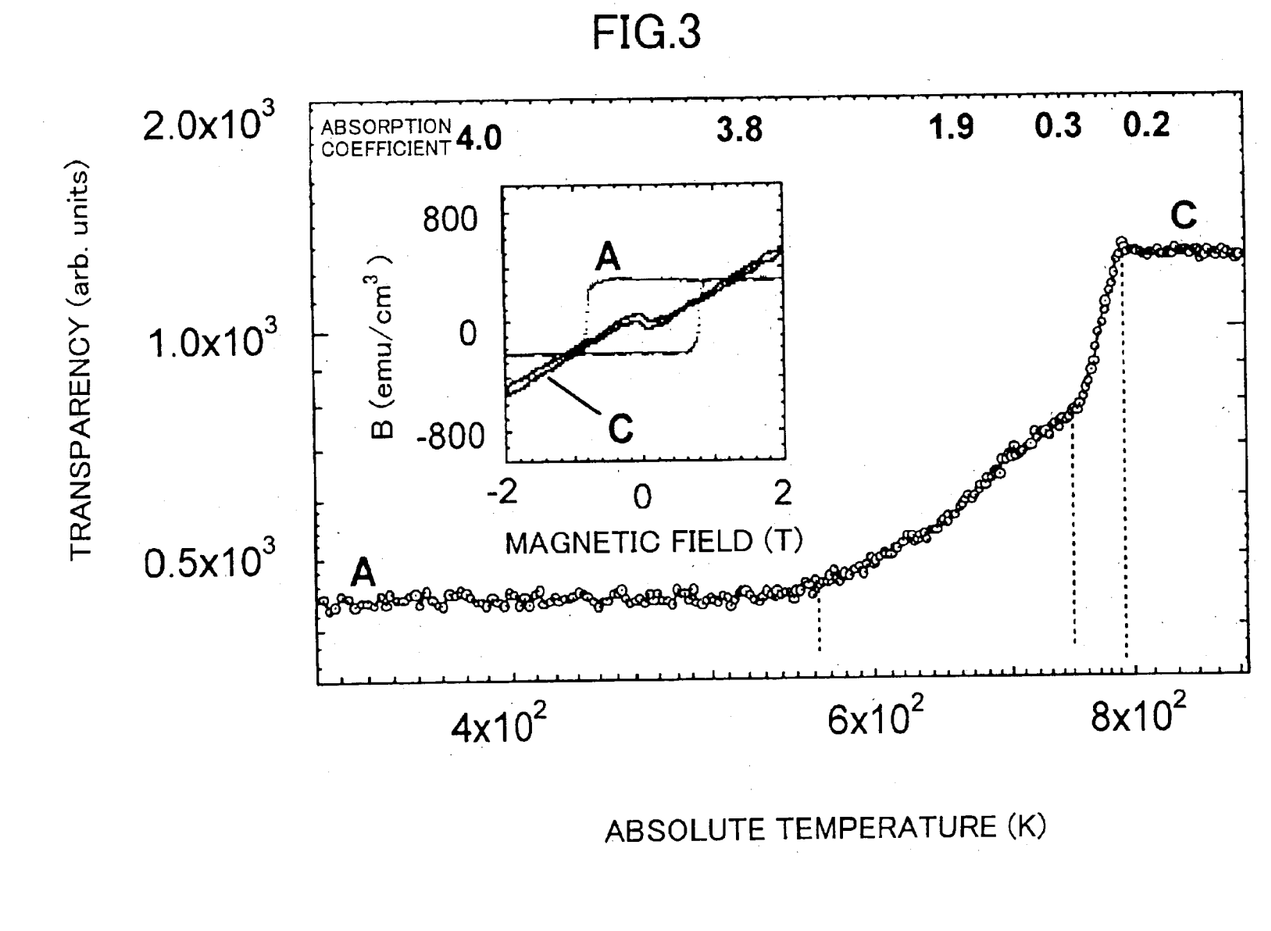
FIG. 3 is a graph showing transparency of the layered structure of a compound semiconductor according to an embodiment of the present invention as a function of temperature to which the layered structure is heated.

FIG. 3 is a graph of the transparency of the TbFeCo inter layer as a function of temperature. The transparency was measured using a multi-channel photo detector connected to an optical microscope.

It is noted from the graph showed in FIG. 3 that the transparency remains at a low level indicated by "A" unless the compound is heated to a temperature of about 600° K. since little chemical reaction and diffusion are induced. The transparency gradually increases between about 600° K. and about 763° K., and the transparency rapidly increases between about 763° K. and about 783° K. The transparency, however, becomes substantially constant as the compound is heated to a temperature more than about 783° K.

A graph of magnetic hysteresis showed in FIG. 3 indicates that the magnetic characteristics of TbFeCo also change by the heating by the application of a laser beam or an electron beam.

Figure 4A:
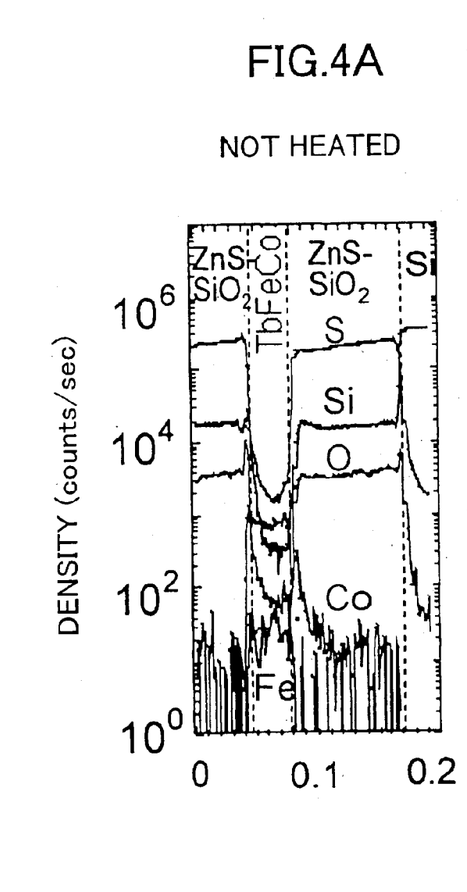
FIGS. 4A–4C are graphs showing density of elements as a function of depth in the layered structure of a compound semiconductor.
Figure 4B:
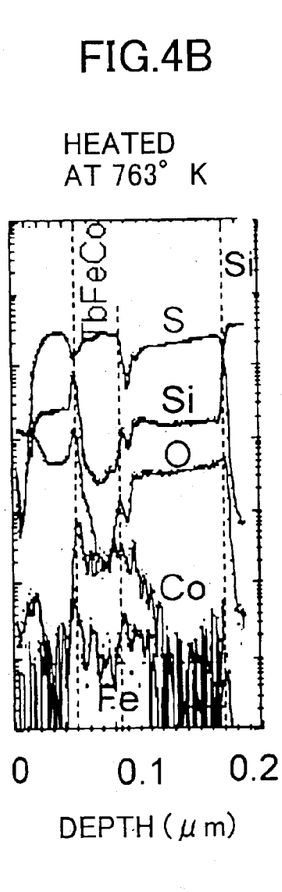
Figure 4C:
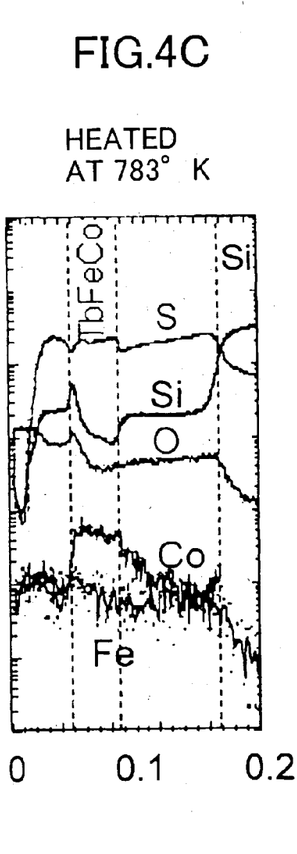

FIGS. 4A–4C are graphs showing the density of each element as a function of depth from the surface of the layered structure.

FIG. 4A indicates that less diffusion of sulfur (S), silicon (Si), oxygen (O), cobalt (Co), and iron (Fe) is induced in the compound that was not heated at all. FIG. 4B indicates that the diffusion is induced to some extent in the compound heated to 763° K. FIG. 4C indicates that the elements are almost saturatedly diffused in the compound heated to 783° K.

The above experimental results indicate that the physical and chemical properties of the layered structure are considerably changed by heating the layered structure by the application of a laser beam or an electron beam. It is possible to use the layered structure as a semiconductor.

Figure 5:
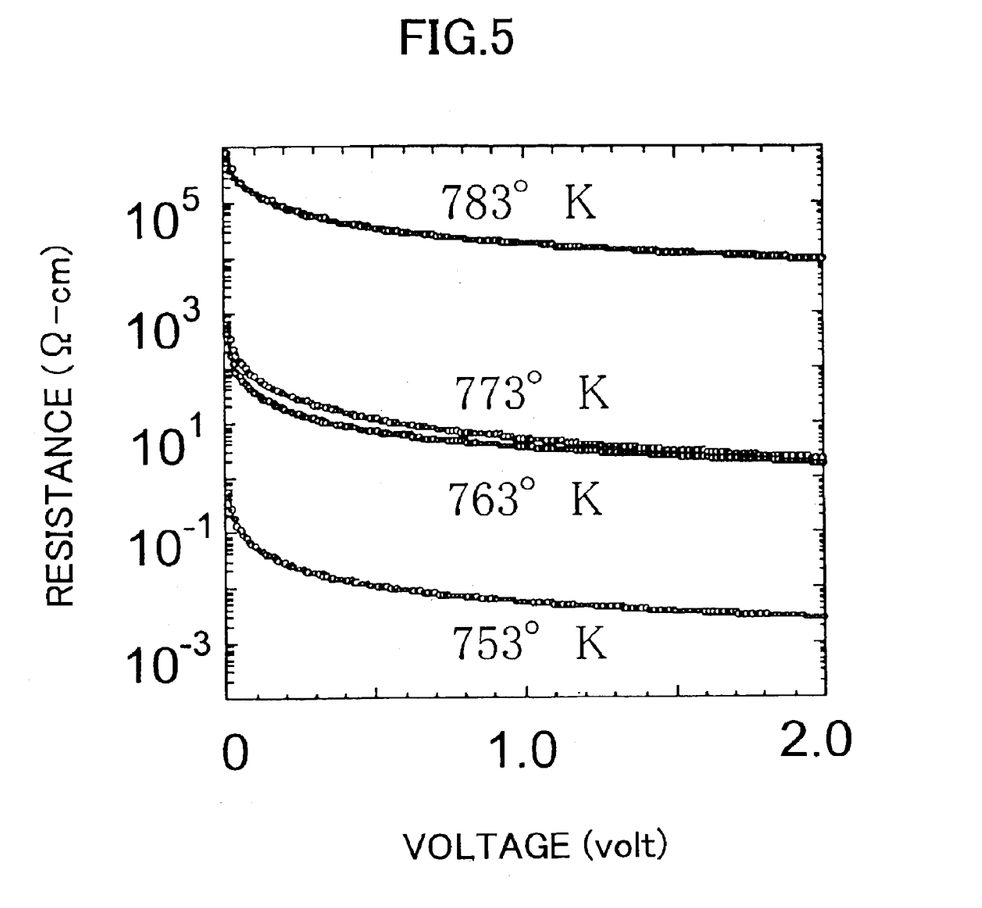
FIG. 5 is a graph showing resistance of the layered structure of compound semiconductor heated at various temperatures, according to an embodiment of the present invention, as a function of voltage.

FIG. 5 is a graph showing resistance as a function of voltage. As showed in FIG. 5, the layered structure heated to 753° K. by a laser beam or an electron beam is a conductor. The resistance data of layered structures heated to 763° K. and 773° K., respectively, indicate that the layered structures are semiconductor. The layered structure heated to 783° K. by a laser beam or an electron beam becomes an insulator.

Accordingly, one can manufacture a compound semiconductor according to the embodiment of the present invention by heating the layered structure consisting of the dielectric layers and the inter layer by the application of a laser beam and an electron beam so that chemical reaction and diffusion of elements are induced in the layered structure. Those skilled in the art understand that electronic circuits are easily fabricated using the compound semiconductor according to the embodiment.

Figure 6:
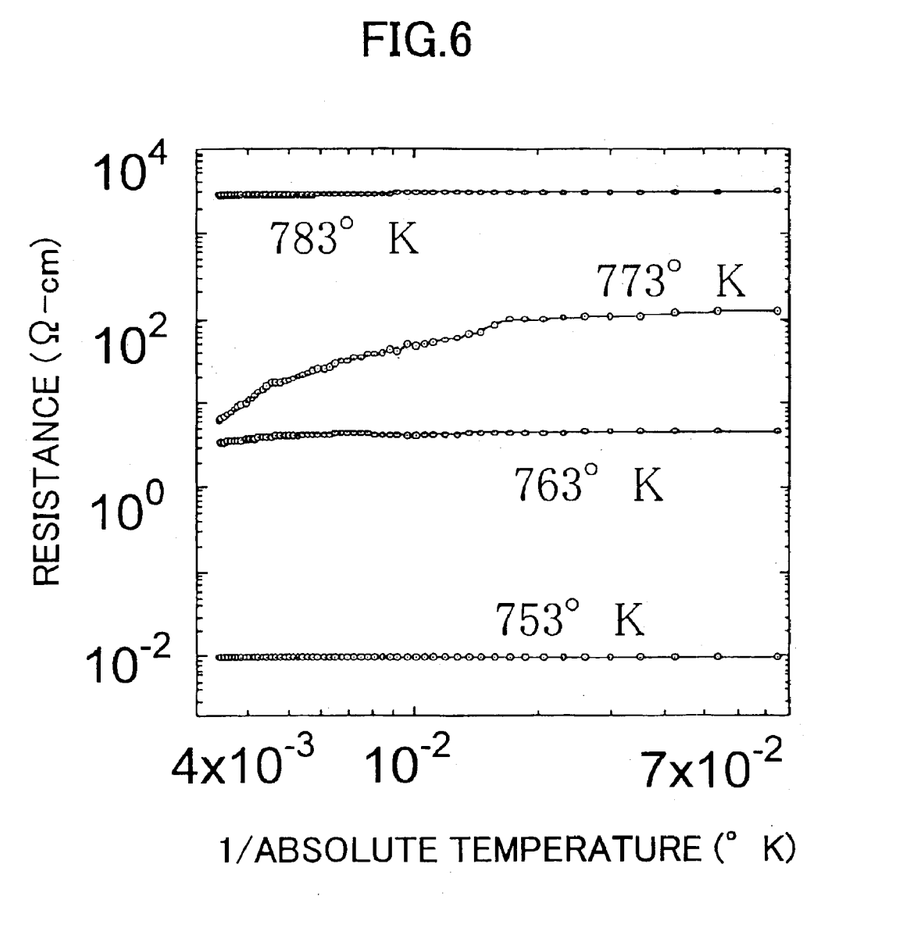
FIG. 6 is a graph showing resistance of the layered structure of a compound semiconductor heated to various temperatures, according to an embodiment of the present invention, as a function of absolute temperature.

FIG. 6 is a graph of resistance as a function of temperature. As showed in FIG. 6, the resistance of the layered structure heated to 753° K. exhibits the properties of conductor; the resistances of the layered structures heated to 763° K. and 773° K. exhibit the properties of a semiconductor; and the resistance of the layered structure heated to 783° K. exhibits the properties of an insulator.

Both experimental results showed in FIGS. 5 and 6 reveal that the compound semiconductor is made by heating the layered structure by the application of a laser beam and an electron beam so as to induce chemical reaction and diffusion of the elements. It is noted that the method of manufacturing a compound semiconductor according to an embodiment of the present invention is applicable to the manufacturing of electronic circuits.

Figure 7:
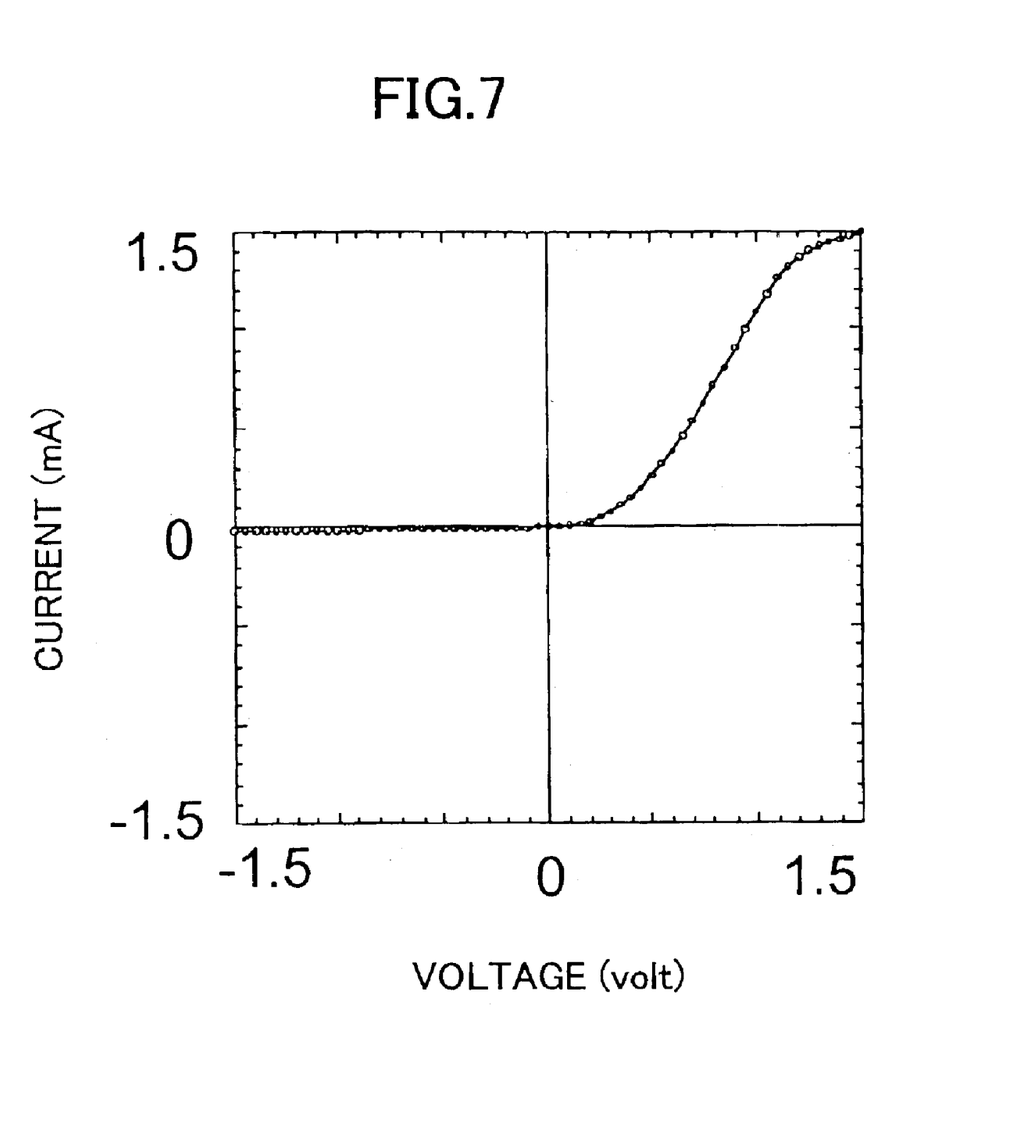
FIG. 7 is a graph showing the current-voltage characteristics of a diode formed by a junction of an n-type semiconductor and a p-type semiconductor according to an embodiment of the present invention.

FIG. 7 is a graph of voltage-current characteristics of a diode that was fabricated by making a junction of an n-type compound semiconductor according to an embodiment of the present invention and a p-type silicon semiconductor. The n-type semiconductor was manufactured by heating the layered structure to 773° K. by the application of a laser beam or an electron beam so as to induce chemical reaction and diffusion.

The voltage-current characteristics showed in FIG. 7 are those of a typical diode. Accordingly, the above experimental data clearly show that the compound semiconductor according to an embodiment of the present invention is applicable to a semiconductor apparatus.

Figure 8:
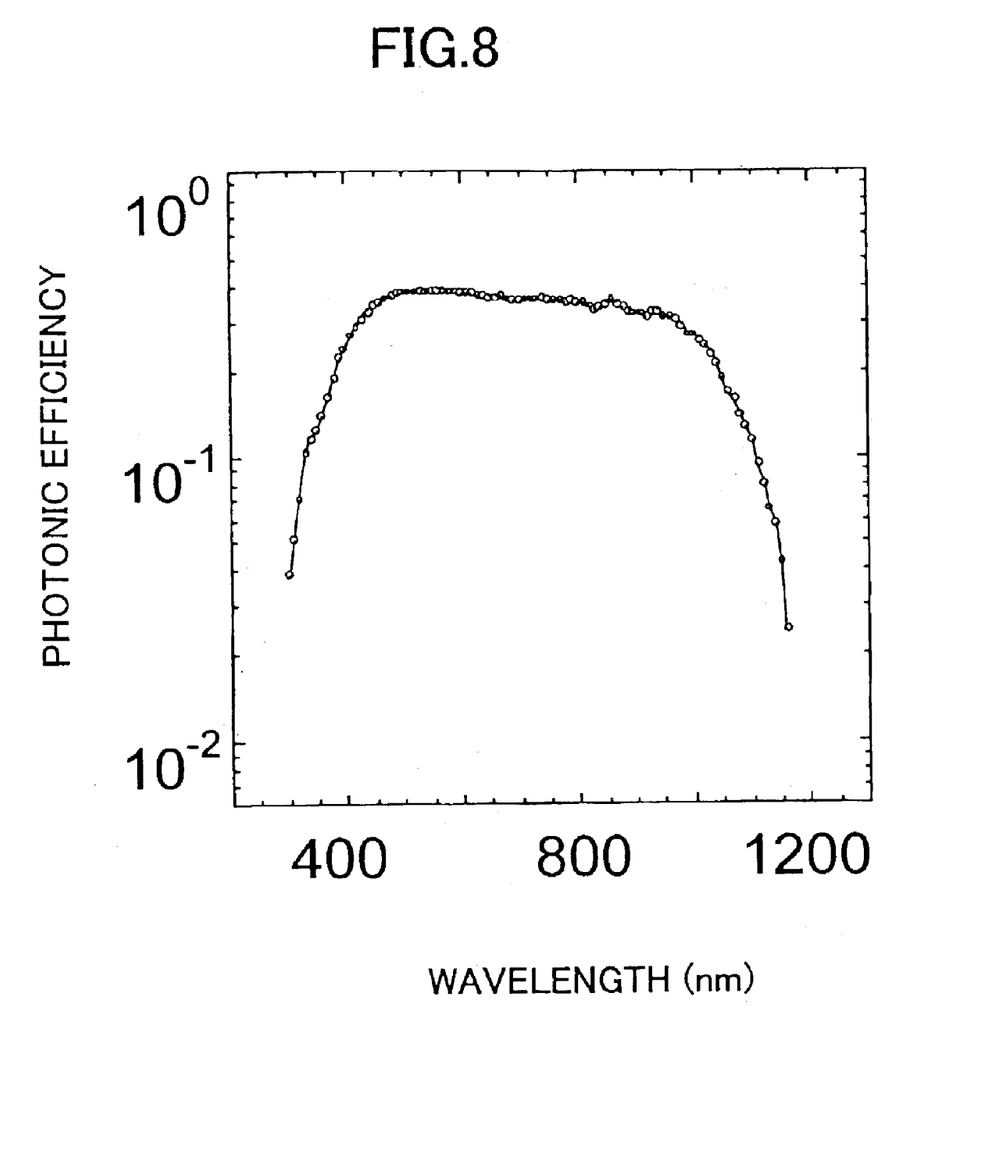
FIG. 8 is a graph showing the photonic efficiency of a photo cell according to an embodiment of the present invention, as a function of wavelength of incidental light.

FIG. 8 is a graph of photonic efficiency of a photo cell consisting of an n-type semiconductor according to an embodiment of the present invention and a p-type silicon semiconductor as a function of wavelength. The n-type semiconductor was manufactured by heating the layered structure to 773° K. by the application of a laser beam or an electron beam so as to induce chemical reaction and diffusion.

As showed in FIG. 8, the photonic efficiency is about 0.4 in a range of wavelengths between 400 nm and 1,000 nm. It is noted that the photonic efficiency, 0.4, is relatively lower than that of a conventional photo cell, however, the compound semiconductor according to an embodiment of the present invention can lower the cost of photo cells because manufacturing thereof is easy.

Figure 9A:
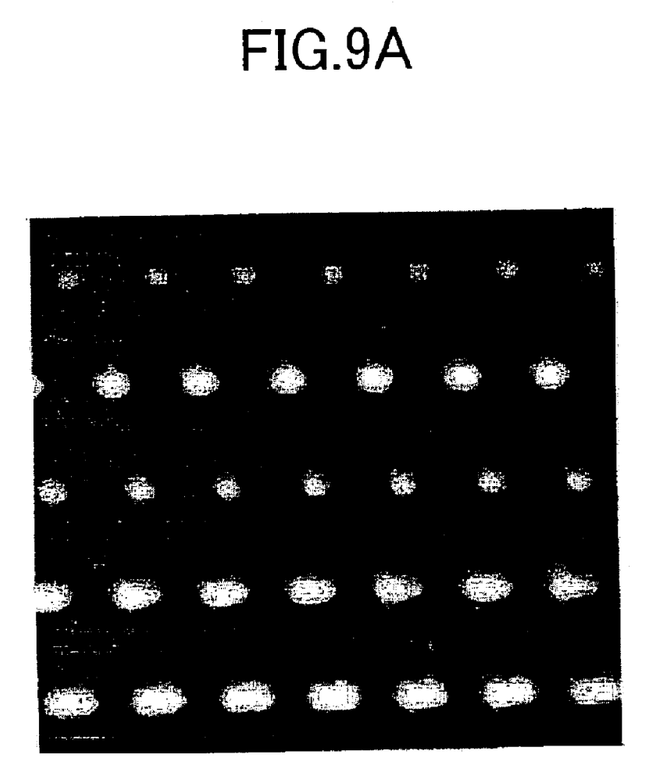
FIGS. 9A and 9B are picture showing marks formed on the layered structure of a compound semiconductor according to an embodiment of the present invention.
Figure 9B:
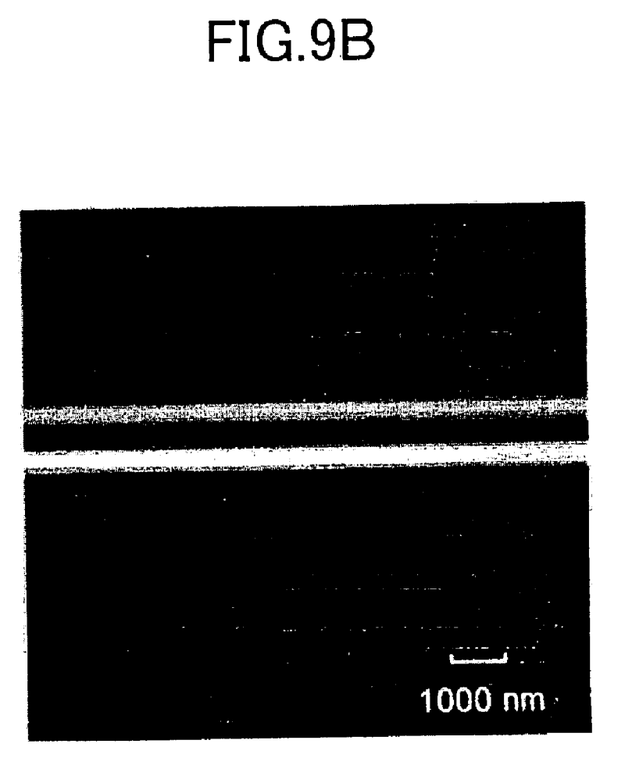

FIGS. 9A and 9B are pictures showing marks formed on the layered structure. In this case, the layered structure was heated by a red laser beam of a 630 nm wavelength.

In FIG. 9A, white marks correspond to the heated portions of the layered structure that were turned into semiconductors by the application of the laser beam. The unheated portions remain conductive and show as black in the picture. It is noted that a 100 nm-long mark is clearly identifiable in the picture.

In FIG. 9B, a thick white line on the lower side corresponds to the heated portion of the layered structure that was turned into a semiconductor by the application of the laser beam; and a narrow white line on the upper side corresponds to the heated portion of the layered structure that was turned into an insulator. The unheated portions remain conductive and show as black in the picture.

Figure 10:
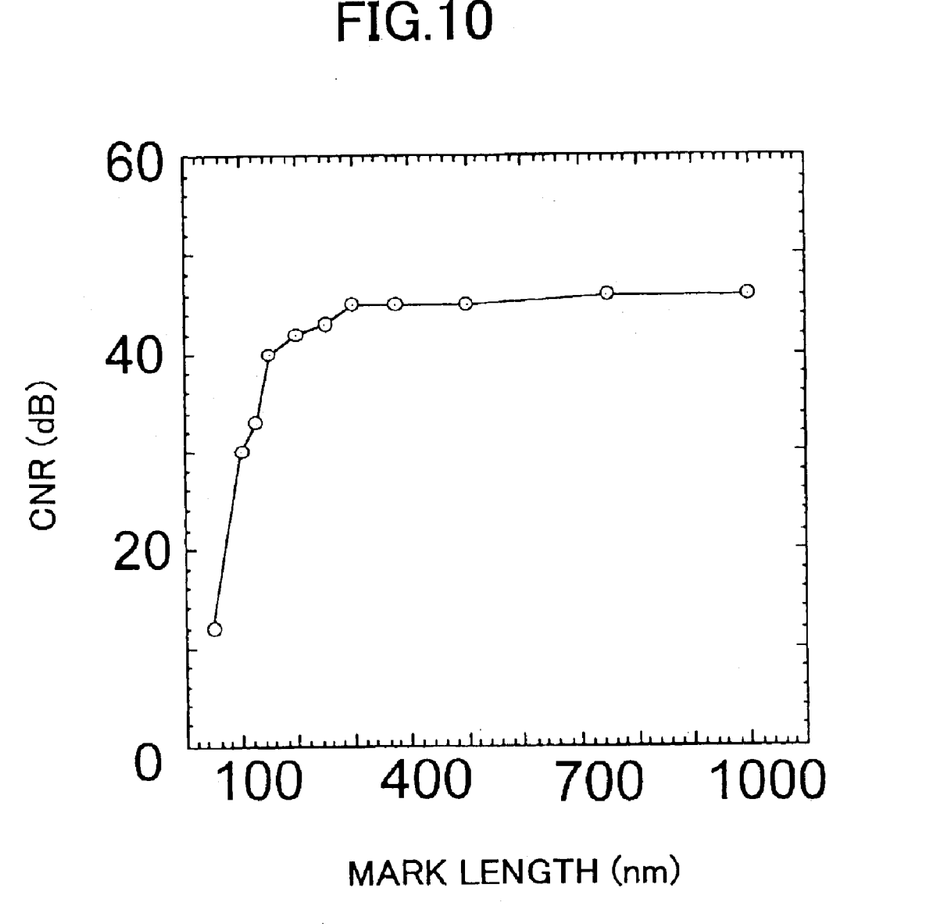
FIG. 10 is a graph showing CNR of the layered structure of a compound semiconductor according to an embodiment of the present invention, as a function of the length of the mark.

FIG. 10 is a graph of carrier-to-noise ratio (CNR) as a function of mark length. The experimental data showed in FIG. 10 indirectly reveal to what extent the compound semiconductor and insulator can be precisely manipulated.

The layered structure was turned into a compound semiconductor by applying a blue laser beam with wavelength being 405 nm, aperture being 0.65, and power being 7.0 mW. Then a blue laser beam of 2.5 mW was applied to the compound semiconductor and reflective light was measured. Since the CNR of a mark longer than 150 nm is 40 dB or more, it is noted that the mark is formed very clearly. The CNR of a 100 nm-long mark is about 20 dB, which indicates that the compound semiconductor is of practical use.

The application of an electron beam improves the precision of manufacturing of the compound semiconductor. Compound semiconductor apparatuses manufactured by an electron beam are about 1/10 the size of those manufactured by the blue laser beam. Accordingly, a compound semiconductor apparatus in the order of several nano-meters can be manufactured easily. The integration level of memory apparatuses is thereby improved.

Figure 11:
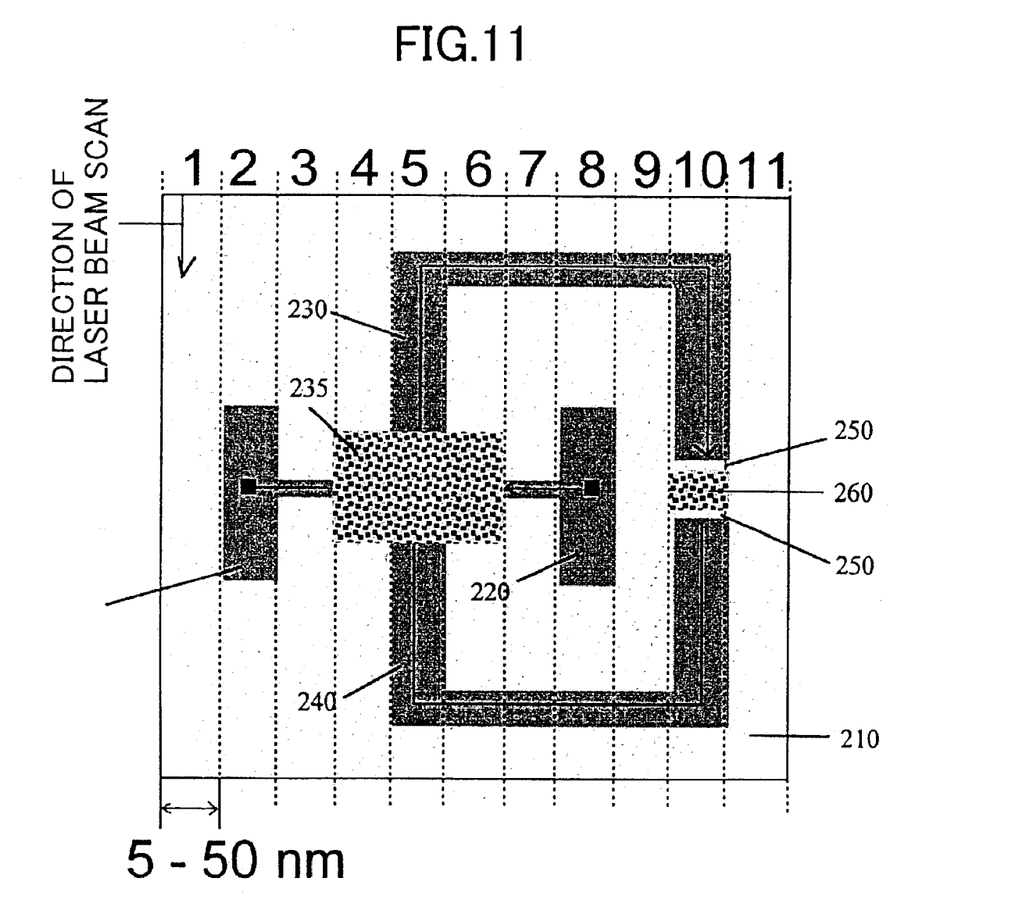
FIG. 11 is a top view of the layered structure of a compound semiconductor according to an embodiment of the present invention, in which semiconductor units and conductive units are formed by scanning with a laser beam.

FIG. 11 is a schematic diagram showing the memory cell of a flash memory according to another embodiment of the present invention.

Semiconductor units 235 and 260 were formed in the layered structure by heating corresponding portions to 773° K. by the application of a laser beam. Insulator unit 210 and 250 were formed in the layered structure by heating corresponding portions to 803° K. The other portions of the layered structure that were not heated remain conductive (conductive units 220, 230, and 240).

The conductive units 220, 230, and 240 function as a gate, a source, and a drain, respectively. The semiconductor unit 235 forms a channel between the source 230 and the drain 240. When a voltage is applied to the gate 220, channel hot electrons are stored in the semiconductor unit 260 functioning as a floating gate.

Figure 12:
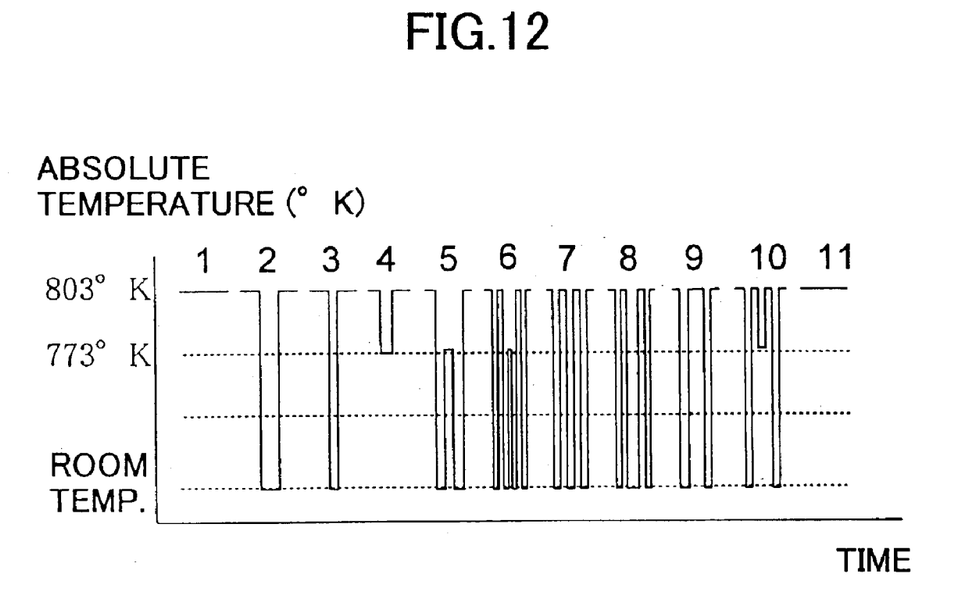
FIG. 12 is a graph of laser beam power as a function of time, applied to the layered structure of a compound semiconductor according to an embodiment of the present invention so as to form the semiconductor units and conductive units of FIG. 11.

FIG. 12 is a graph showing the change in the temperature of the layered structure that was heated by the application of a laser beam to fabricate the memory cell of the flash memory showed in FIG. 11. Since the flash memory according to an embodiment of the present invention can be manufactured by scanningly heating the layered structure by a laser beam or an electron beam, the manufacturing of the flash memory becomes simple and of low cost.

In the case where the semiconductor unit 260 is replaced with an insulator, an electric field is applied to the insulator while a voltage is applied to the gate 220. When no voltage is applied to the gate, the electric field in the insulator vanishes. Accordingly, if the semiconductor unit 260 of FIG. 11 is formed as an insulator instead of a semiconductor, the compound semiconductor thus manufactured can be used as a DRAM memory cell. The manufacturing of the DRAM memory becomes simple and of low cost.

If the insulator unit 250 and the semiconductor unit 260 of FIG. 11 are replaced with a voltage source, and a voltage is applied to the gate 220, the semiconductor unit 235, as a channel, lets a current flow between the source 230 and the drain 240. The compound semiconductor apparatus thus manufactured functions as a transistor of which manufacturing is simple and of low cost.

One can form wirings on the electronic circuit, the photo cell, the flash memory cell, the DRAM memory cell, and the transistor described above by forming an insulator layer of metal oxide thereon and heating the metal oxide layer so as to dissolve (melt) the metal oxide and make it conductive. For example, AgOx can be used as the metal oxide. Sulfurized metal can be used instead of the metal oxide.

In summary, a compound semiconductor and a compound insulator can be provided by the methods according to various aspects of the present invention described above. It is possible to form a photo cell, an electronic circuit, a transistor, a dynamic random access memory, flash memory, and so forth, at low cost, using the compound semiconductor and compound insulator thus manufactured.

The preferred embodiments of the present invention are described above. The present invention is not limited to these embodiments, but various variations and modifications may be made without departing from the scope of the present invention.

This patent application is based on Japanese Laid-open Patent Application No. 2002-092663 filed on Mar. 28, 2002, the entire contents of which are hereby incorporated by reference.

What is claimed is:

1. A method of manufacturing a compound semiconductor, comprising the steps of:

forming a layered structure of a plurality of dielectric layers an inter layer fawned between said dielectric layers, said dielectric layers including one of oxygen, sulfur, and both oxygen and sulfur, said inter layer including one of rare earth transition metal, rare earth metal, transition metal, and both ran, earth metal and transition metal that are highly reactive to oxygen and sulfur; and heating said layered structure, wherein the heating induces chemical reaction and diffusion of elements in the layered structure.

2. The method as claimed in claim 1, wherein said layered structure is heated by application of a laser beam.

3. The method as claimed in claim 1, wherein said layered structure is heated by application of an electron beam.

4. The method as claimed in claim 1, wherein said layered structure is heated to a temperature of 753° K. or more and less than 783° K.

5. The method as claimed in claim 1, wherein said dielectric layers and said inter layer are formed simultaneously as a single layer.

6. A method of manufacturing a compound insulator, comprising the steps of:

forming a layered structure of a plurality of dielectric layers and an inter layer formed between said dielectric layers, said dielectric layers including one of oxygen, sulfur, and both oxygen and sulfur, said inter layer including one of rare earth transition metal, rare earth metal, transition metal, and both rare earth metal and transition metal that are highly reactive to oxygen and sulfur, and heating said layered structure, wherein the heating induces chemical reaction and diffusion of elements in the layered structure.

7. The method as claimed in claim 6, wherein said layered structure is heated by application of a laser beam.

8. The method as claimed in claim 6, wherein said layered structure is heated by application of an electron beam.

9. The method as claimed in claim 6, wherein said layered structure is heated to a temperature of 783° K. or more.

10. The method as claimed in claim 6, wherein said dielectric layers and said inter layer are formed simultaneously as a single layer.

11. A method of manufacturing an electronic circuit, comprising the steps of:

forming a layered structure of a plurality of dielectric layers and an inter layer formed between said dielectric layers, said dielectric layers including one of oxygen, sulfur, and both oxygen and sulfur, said inter layer including one of rare earth transition metal, rare earth metal, transition metal, and both rare earth metal and transition metal that are highly reactive to oxygen and sulfur; and heating portions of said layered structure to at least one of a temperature less than 753° K. so as to form a conductive unit, a temperature of 753° K. or more and less than 783° K. so as to form a semiconductor unit, and a temperature of 783° K. or more so as to form an insulator unit by inducing chemical reaction and diffusion of elements.

12. The method as claimed in claim 11, wherein said layered structure is heated by application of a laser beam.

13. The method as claimed in claim 11, wherein said layered structure is heated by application of an electron beam.

14. The method as claimed in claim 11, wherein said dielectric layers and said inter layer are formed simultaneously as a single layer.

15. The method as claimed in claim 11, further comprising the steps of:

forming an insulator layer of metal oxide on said layered structure;

forming a lead line by heating a portion at said insulator layer so as to make said portion conductive.

16. The method as claimed in claim 15, wherein said metal oxide is AgOx.

17. An electronic circuit, manufactured by the method as claimed in claim 11.

18. The electronic circuit as claimed in claim 17, wherein said layered structure is heated by application of a laser beam.

19. The electronic circuit as claimed in claim 17, wherein said layered structure is heated by application of an electron beam.

20. The electronic circuit as claimed in claim 17, wherein said electric layers and said inter layer are formed simultaneously as a single layer.

21. The electronic circuit as claimed in claim 17, wherein said method further comprising the steps of:

forming an insulator layer of metal oxide on said layered structure;

forming a lead line by heating a portion of said insulator layer so as to make said portion conductive.

22. The electronic circuit as claimed in claim 21, wherein said metal oxide is AgOx.

* * * * *